(12) United States Patent
Kozaki

(10) Patent No.: US 7,228,101 B2
(45) Date of Patent: Jun. 5, 2007

(54) SATELLITE BROADCAST RECEPTION CONVERTER

(75) Inventor: Masato Kozaki, Suita (JP)

(73) Assignee: Sharp Kabushiki Kaisha, Osaka (JP)

( * ) Notice: Subject to any disclaimer, the term of this patent is extended or adjusted under 35 U.S.C. 154(b) by 524 days.

(21) Appl. No.: 10/735,905

(22) Filed: Dec. 16, 2003

(65) Prior Publication Data

US 2004/0127186 A1    Jul. 1, 2004

(30) Foreign Application Priority Data

Dec. 17, 2002  (JP) .............................. 2002-364705

(51) Int. Cl.
  *H04B 7/185* (2006.01)
  *H04Q 7/20* (2006.01)
(52) U.S. Cl. ...................... 455/12.1; 455/427
(58) Field of Classification Search ............... 455/12.1, 455/427
  See application file for complete search history.

(56) References Cited

U.S. PATENT DOCUMENTS

| | | | |
|---|---|---|---|
| 2003/0058183 A1* | 3/2003 | Nakagawa et al. | 343/786 |
| 2003/0068980 A1* | 4/2003 | Nakagawa et al. | 455/13.3 |
| 2003/0222828 A1* | 12/2003 | Suga | 343/786 |
| 2004/0110466 A1* | 6/2004 | Perlman | 455/12.1 |

FOREIGN PATENT DOCUMENTS

| | | | |
|---|---|---|---|
| EP | 1349231 A2 * | 10/2003 | |
| JP | 5-75491 A | 3/1993 | |
| JP | 10-32503 A | 2/1998 | |
| JP | 2000-252-709 A | 9/2000 | |

* cited by examiner

*Primary Examiner*—Edan Orgad
*Assistant Examiner*—Bobbak Safaipour
(74) *Attorney, Agent, or Firm*—Birch, Stewart, Kolasch & Birch, LLP

(57) ABSTRACT

A satellite broadcast reception converter, having a simple structure, capable of reducing an output return loss even if a circuit board is relatively smaller than a chassis is provided. A satellite broadcast reception converter comprises a chassis in which a primary reflector into which radio wave signals received by an external parabola antenna are guided and an output terminal to be connected to an external tuner are placed at a predetermined distance from each other so that signals fed from the primary reflector are amplified and converted into intermediate-frequency output signals so as to be fed out through the output terminal, wherein the satellite broadcast reception converter further comprises a circuit board of which another end portion thereof is connected to the primary reflector and an auxiliary board of which another end portion thereof is connected to the output terminal by way of a lead wire, and wherein the circuit board and the auxiliary board are connected together at one end portions thereof and laid in a contiguous sequence in the chassis in such a manner that the circuit board is laid closer to the primary reflector and the auxiliary board is laid closer to the output terminal.

8 Claims, 6 Drawing Sheets

SATELLITE BROADCAST RECEPTION CONVERTER

This Nonprovisional application claims priority under 35 U.S.C. § 119(a) on Patent Application No(s). 2002-364705 filed in JAPAN on Dec. 17, 2002, the entire contents of which are hereby incorporated by reference.

BACKGROUND OF THE INVENTION

1. Field of the Invention

The present invention relates to a satellite broadcast reception converter that constitutes the basis of a satellite broadcast reception system together with an antenna and a tuner. More particularly, the present invention relates to a satellite broadcast reception converter having an internal structure by which an output return loss is reduced.

2. Description of the Prior Art

The satellite broadcast reception converter (hereinafter referred to as an LNB) is fed with faint radio wave signals in a high-frequency band received by an external parabola antenna from a satellite, amplifies the signals thus fed in, converts the signals into output signals (hereinafter referred to as IF signals) in an intermediate frequency band (a range between approximately 950 MHz and 1700 MHz has been a band commonly used in recent years) for easy handling, and feeds out the output signals to an external tuner.

A conventional LNB having the above-mentioned functions is generally formed with a chassis or a case 1 as an external structure as shown in FIGS. 7 and 8. Arranged at one end and another end of the LNB respectively so as to protrude outward therefrom are a primary reflector 2 into which a radio wave received by an unillustrated parabola antenna is guided and an F-type connector as an output terminal 3 to be connected to an unillustrated tuner with a coaxial cable or the like. Furthermore, a circuit board 4 is provided, inside the case 1, within a region between a rear side of the primary reflector 2 and an area adjacent to the output terminal 3. One end portion 4a of the circuit board 4 is connected to the output terminal 3 by way of an F-type line or a lead wire 5 and another end portion 4b is connected to the primary reflector 2. As can be seen, inside the case 4, sizes of the case 1 and the circuit board 4 are substantially identical in plan view.

With advancement in integration technologies that enable miniaturizations of circuit components and circuit patterns arranged on such a circuit board as the circuit board 4, and in an attempt to reduce the cost in materials by effectively utilizing these technologies, recent trends show that a circuit board such as the circuit board 4 has been reduced in size. In this case, for example as shown in FIG. 9, a circuit board 14 is arranged within the case 1 in such a way that another end portion 14b thereof can be connected to the rear side of the primary reflector 2. Consequently, one end portion 14a of the circuit board 14 is located remotely from the output terminal 3, and said one end portion 14a is connected to the output terminal by way of an extended lead wire 15.

Here, by comparing FIG. 7 and FIG. 8, it is understood that the size of the case 1 remains unchanged and that the primary reflector 2 and the output terminal 3 are so positioned as to keep a predetermined distance from each other. In this arrangement, it is possible to share the same LNB among different products by fixing the position of the LNB relative to the parabola antenna. The LNB, in general, is fixed relative to the antenna with a fixing tool by making the output terminal 3 as a fixing base. Because of this reason, if the distance between the primary reflector 2 and the output terminal 3 differs from product to product, a focal point of the primary reflector 2 changes accordingly.

Here, such an LNB as the one shown in FIG. 9 has a longer lead wire 15 that induces unnecessary inductance components therearound which prevent a proper impedance matching from being taken. As a result, the output return loss of the IF signals, an indicator of the basic performance of the LNB, is worsened.

Conventional technologies for improving the problem like this include one that provides an earth portion integrally formed within the case 1 or a ground component in the case 1 so that the earth portion or the ground component is placed in close proximity to the lead wire 15 (for example, the Japanese Patent Application Laid-Open No. 2000-252709, page 2 to page 4 and FIG. 1 to FIG. 3). According to this improved technology, capacitive components that are induced between the lead wire 15 and the earth portion or the ground component prevent unnecessary inductance components from being induced. Consequently, it is possible to take a proper impedance matching and, thereby, at least improve the output return loss of the IF signals.

However, according to the aforementioned conventional improved technology, it is necessary to secure an infinitesimal distance between the lead wire 15 and the earth portion or the ground component. To achieve this, it is imperative to devise a practical method at a designing stage such as covering the lead wire 15 with an insulating tube or at a manufacturing stage such as improving dimensional accuracy. Moreover, this technology has a drawback of making inside the case 1 complicated.

SUMMARY OF THE INVENTION

A feature of the present invention is, in light of the above-mentioned problems, to provide a satellite broadcast reception converter, having a simple structure, capable of reducing an output return loss even if a circuit board is relatively smaller than a chassis.

In accordance with the above feature and according to one aspect of the present invention, a satellite broadcast reception converter comprises a chassis in which a primary reflector into which radio wave signals received by an external parabola antenna are guided and an output terminal to be connected to an external tuner are placed at a predetermined distance from each other so that signals fed from the primary reflector are amplified and converted into intermediate-frequency output signals so as to be fed out through the output terminal, wherein the satellite broadcast reception converter further comprises a circuit board of which another end portion thereof is connected to the primary reflector and an auxiliary board of which another end portion thereof is connected to the output terminal by way of a lead wire, and wherein the circuit board and the auxiliary board are connected together at one end portions thereof and laid in a contiguous sequence in the chassis in such a manner that the circuit board is laid closer to the primary reflector and the auxiliary board is laid closer to the output terminal. By this configuration, because the lead wire to be connected to the output terminal becomes shorter, unnecessary inductance components that adversely affect an impedance matching and an output return loss are hardly induced around the lead wire. Therefore, it becomes possible to take a proper impedance matching and thereby reduce the output return loss of the IF signals.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
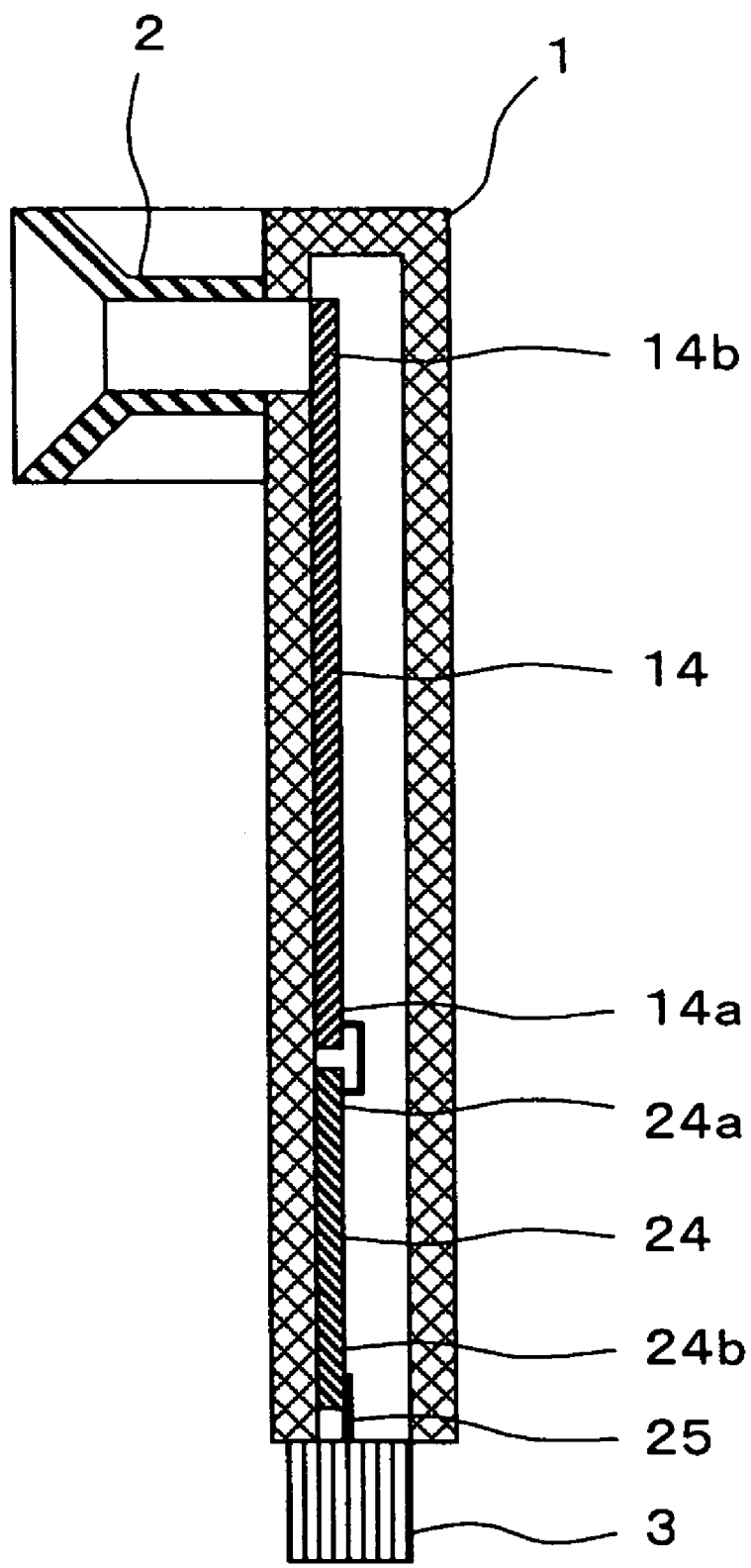
FIG. 1 is a schematic diagram showing an overall structure of an LNB of a first embodiment in longitudinal section view.
Figure 2:
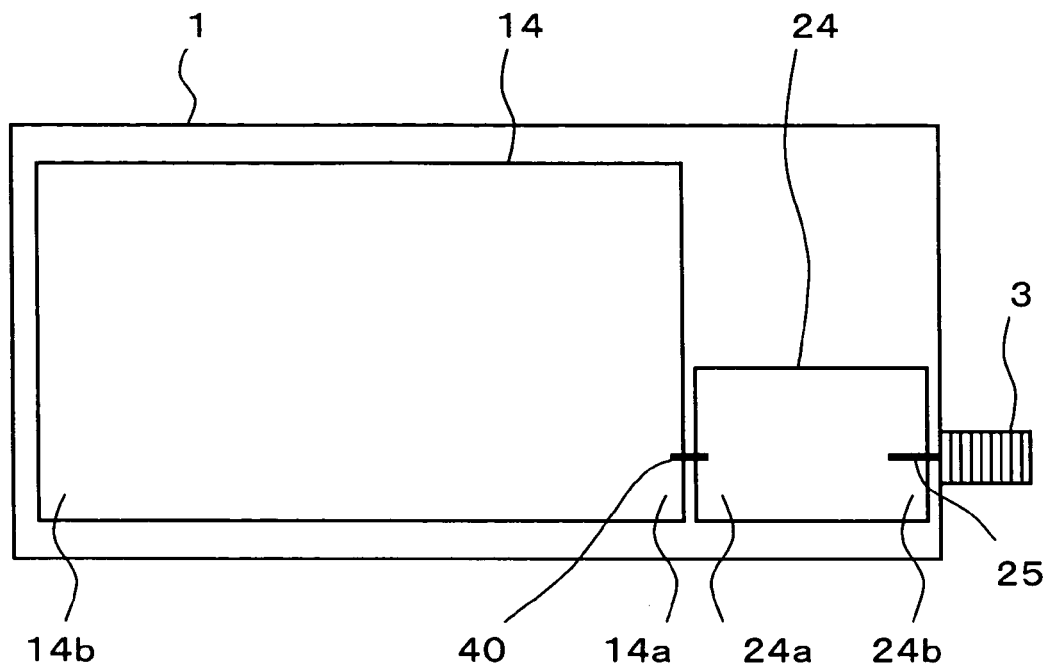
FIG. 2 is a schematic diagram showing an internal structure of the LNB of the first embodiment in perspective plan view.
Figure 3:
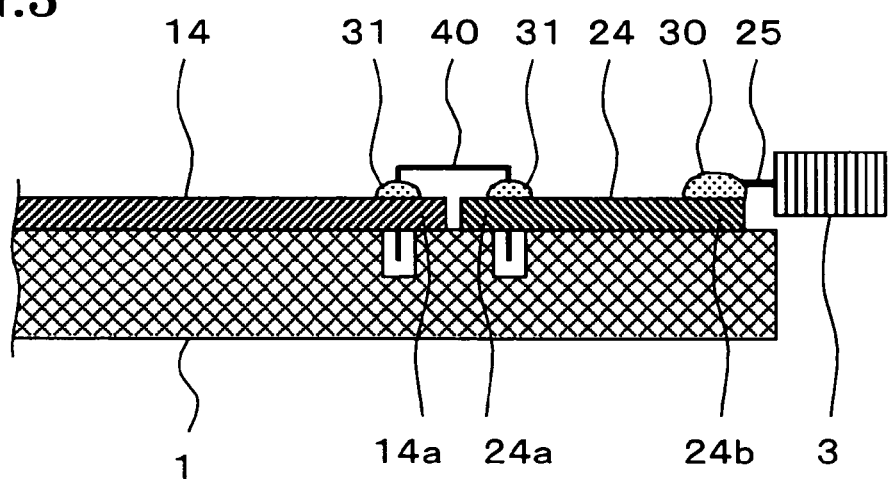
FIG. 3 is a schematic diagram showing main components of the LNB in longitudinal section view.
Figure 9:
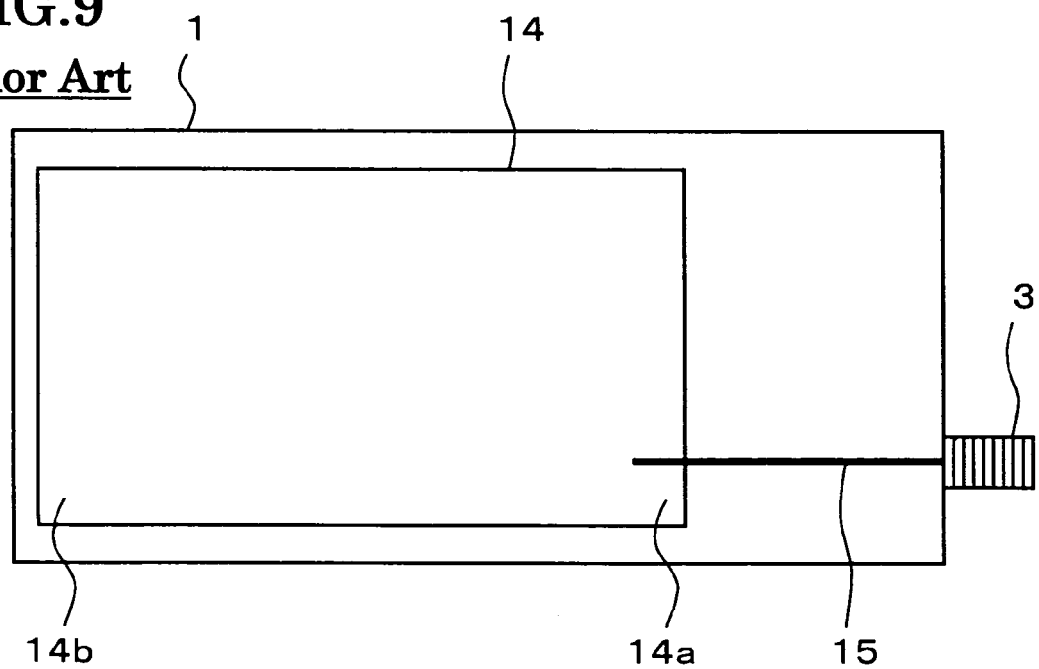
FIG. 9 is a schematic diagram showing an internal structure of another conventional LNB in perspective plan view.

Hereinafter, embodiments of the present invention will be described in details with reference to the accompanying drawings. First, an LNB of a first embodiment of the present invention will be described. FIG. 1 is a schematic diagram showing an overall structure of the LNB of the first embodiment in longitudinal section view. FIG. 2 is a schematic diagram showing an internal structure of the LNB in perspective plan view. FIG. 3 is a schematic diagram showing main components of the LNB in longitudinal section view. Such components as are found also in FIG. 9 and having the same name and function are identified with the same reference numerals and descriptions thereof are not repeated accordingly. The same applies to a second and a third embodiments that will be described later.

As shown in FIG. 1 and FIG. 2, the LNB comprises a case 1 as an external structure and has a primary reflector 2 (a waveguide-type reflector having a conical electromagnetic horn is shown in FIG. 1 as an representing example) at one end and an output terminal 3 at another end thereof respectively so as to protrude therefrom and remain at a predetermined distance from each other. Furthermore, inside the case 1, a circuit board 14 is arranged in such a way that another end portion 14b thereof is connected to a rear side of the primary reflector 2. At the same time, an auxiliary board 24 is so arranged that one end portion 24a thereof is successively placed in a row with one end portion 14a of the circuit board 14 and that another end portion 24b of the auxiliary board 24 is located in proximity to the output terminal 3. The one end portion 24a of the auxiliary board 24 is electrically connected to the one end portion 14a of the circuit board 14, and the other end portion 24b of the auxiliary board 24 is connected to the output terminal 3 by way of a lead wire 25.

It is to be noted that the other end portion 24b of the auxiliary board 24 and the lead wire 25 are connected together through a soldered portion 30.

Now, electrical connection methods for connecting the circuit board 14 and the auxiliary 24 together will be described with reference to FIG. 3. As shown in FIG. 3, the circuit board 14 and the auxiliary board 24 are laid next to each other so that the one end portions 14a and 24a will be located close to each other within the case 1. Then, a pin 40 having a "U" shape in longitudinal cross view is placed like a bridge between circuit land patterns that are formed on the one end portions 14a and 24a respectively so as to connect them together through soldered portions 31.

Figure 4:
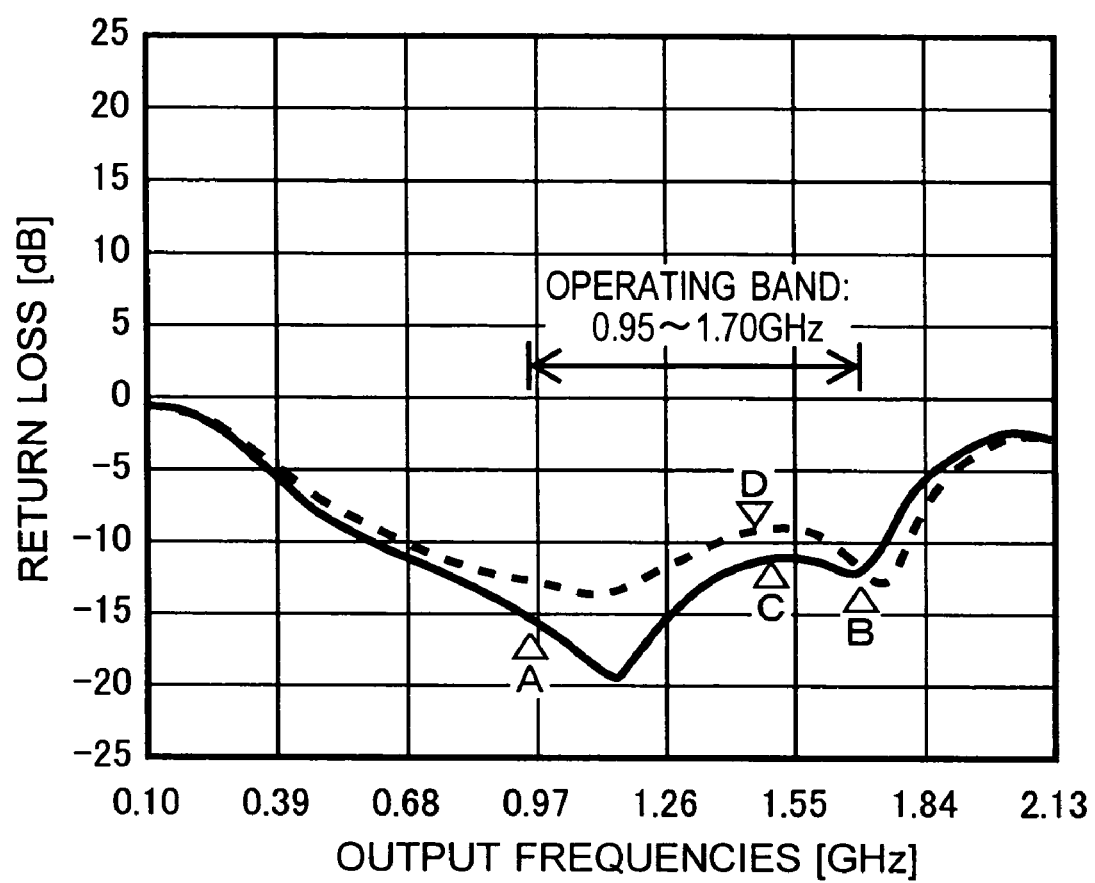
FIG. 4 is a diagram showing a correlation between output frequencies of IF signals and a return loss of the LNB of the first embodiment.

Despite the smaller circuit board 14 relative to the case 1 in plan view inside the case 1 as explained before, the lead wire 25 to be connected to the output terminal 3 becomes shorter by merely placing and electrically connecting the auxiliary board 14 between the smaller circuit board 14 and the output terminal 3. As a result, unnecessary inductance components are not induced around the lead wire 25. This makes it possible to take a proper impedance matching and thereby reduce the output return loss of the IF signals. FIG. 4 shows such an example.

FIG. 4 is a diagram showing a correlation between output frequencies of the IF signals and the return loss of the LNB, i.e., VSWR (Voltage Standing Wave Ratio). In the diagram, a solid line shows characteristics of the LNB of the first embodiment and a broken line, for a comparison purpose, shows characteristics of the conventional LNB (the LNB shown in FIG. 9 and without having the aforementioned improved technology). The conventional LNB, as shown in FIG. 4, shows the output return loss of −13.6 dB at minimum and −9.2 dB at maximum (point D in the diagram) within a operating band width between the output frequencies of 950 MHz and 1700 MHz (a range between point A and point B in the diagram). By contrast, the LNB embodying the invention shows the output return loss of −14.2 dB at minimum and −11.2 dB at maximum (point C in the diagram) within the operating band width. As can be seen, an improvement of the output return loss is achieved.

Figure 5:
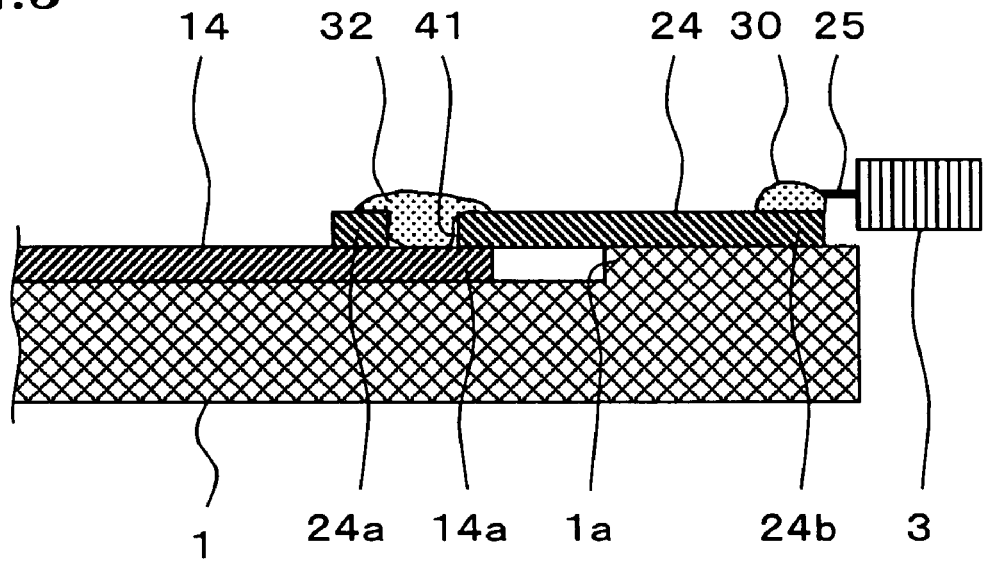
FIG. 5 is a schematic diagram showing main components of an LNB of a second embodiment in longitudinal section view.

Next, a second embodiment of the present invention will be described with reference to FIG. 5. FIG. 5 is a schematic diagram showing main components of an LNB of the second embodiment in longitudinal section view. Distinctive features of the second embodiment are found in an electrical connection method that is modified from the first embodiment for connecting the circuit board 14 and the auxiliary board 24 together.

In this embodiment, as shown in FIG. 5, on an inner surface of the case 1 at a side of the output terminal 3 is formed a projected portion 1a whose height is identical with a thickness of the circuit board 14. Then the auxiliary board 24 is placed on top of the projected portion 1a. The circuit board 14 and the auxiliary board 24 are placed in such a manner in which one end portion 24a of the auxiliary board 24 is laid on one end portion 14a of the circuit board 14. At the same time, a circuit land pattern is formed on the one end portion 14a on which the one end portion 24a of the auxiliary board is laid, and another circuit land pattern is also formed on the one end portion 24a of the auxiliary board 24. In addition, there is a through hole 41 formed in the one end portion 24a of the auxiliary board 24 so that the through hole 41 extends from the circuit land pattern on the auxiliary board 24 to the circuit land pattern on the circuit board 14. Thereafter, the through hole 41 is filled with solder used for a soldered portion 32 for connecting the two together.

In this embodiment, as already explained, the circuit board 14 and the auxiliary board 24 are laid on each other at the one end portions 14a and 24a. Although the auxiliary board 24 becomes slightly larger in size in comparison with the first embodiment and this increases a material cost slightly, it provides an advantage in that the connection is secured by a binding force of the solder used for the soldered portion 32 filled in the through hole 41.

Figure 6:
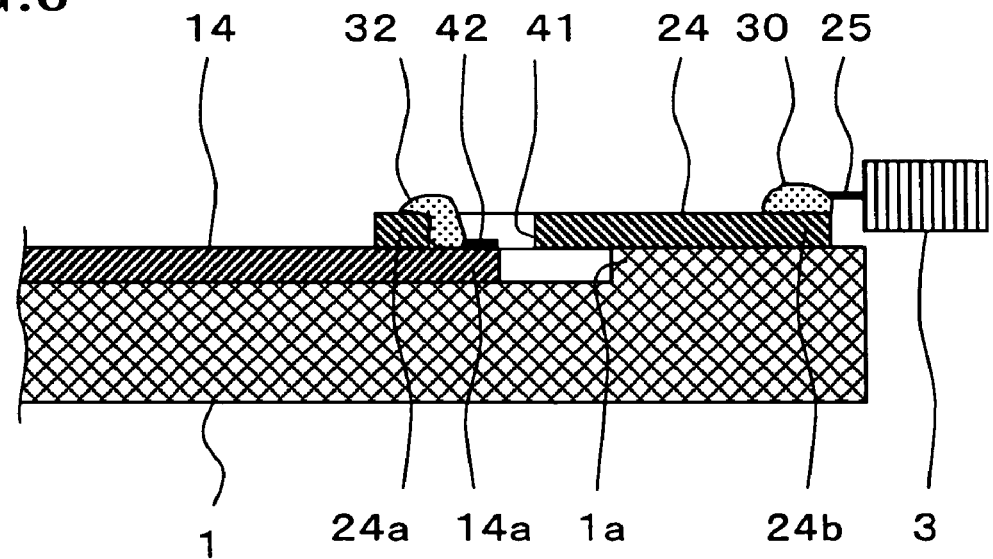
FIG. 6 is a schematic diagram showing main components of an LNB of a third and a forth embodiments in longitudinal section view.
Figure 7:
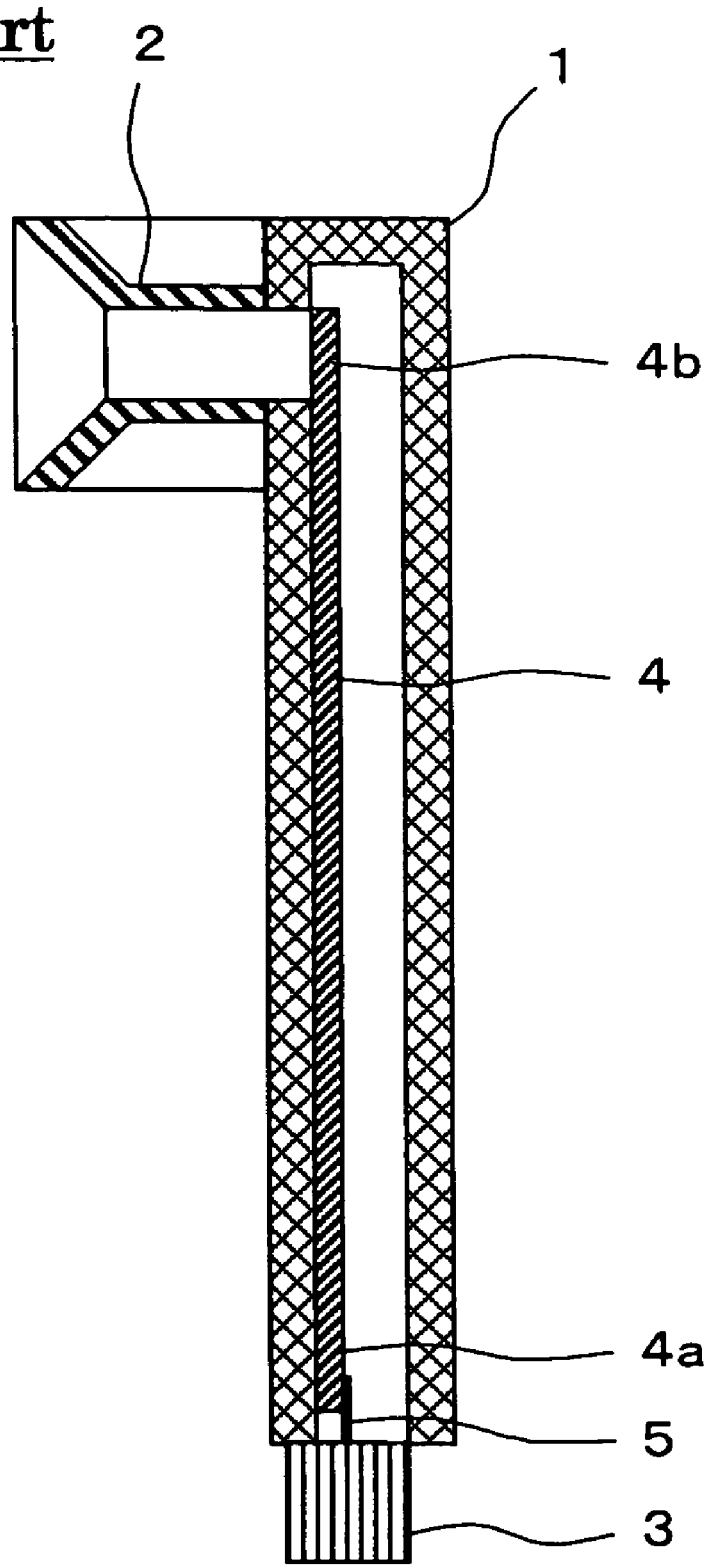
FIG. 7 is a schematic diagram showing an overall structure of a conventional LNB in longitudinal section view.
Figure 8:
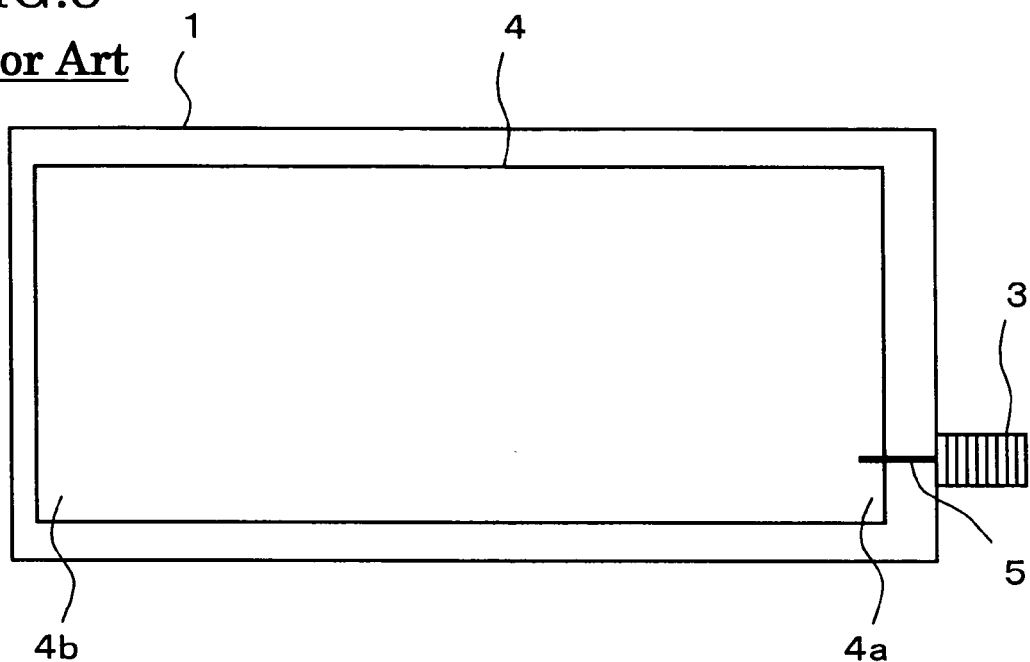
FIG. 8 is a schematic diagram showing an internal structure of the conventional LNB in perspective plan view.

Next, a third embodiment of the present invention will be described with reference to FIG. 6. FIG. 6 is a schematic diagram showing main components of an LNB of the third embodiment in longitudinal section view. A distinctive feature of the third embodiment is an adjustable filling amount of the solder used for the soldered portion 32 as used in the second embodiment. By this feature, it is possible to regulate the filling amount.

In this embodiment, as shown in FIG. 6, a photoresist 42 for acting as an embankment (an elevation) is formed on the circuit land pattern on the one end portion 14a of the circuit board 14 and around a perimeter of the circuit land pattern towards the side of the output terminal 3. The photoresist 42 is formed in such a way that, when the circuit board 14 and the auxiliary board 24 are laid on each other at the one end portions 14a and 24a, the photoresist 42 comes in the through hole 41 that is formed in the one end portion 24a of the auxiliary board 24 and plays the role of regulating the amount of solder by holding back the solder used for the soldered portion 32. As a result, it is possible to prevent the solder used for the soldered portion 32 from being filled excessively.

Furthermore, as shown in FIG. 6, the third embodiment has an advantage over the second embodiment that the auxiliary board 24 can be made smaller in size by forming the photoresist 42 on the one end portion 14a of the circuit board 14 and on an area nearest to the output terminal 42, i.e., at the edge.

Next, a forth embodiment of the present invention will be described. A distinctive feature of the forth embodiment is found in an enhanced workability in soldering the soldered portion 32 for connecting the circuit board 14 and the auxiliary board 24 together electrically as described in the second embodiment. This embodiment will be described by utilizing FIG. 6 that was referred to when the aforementioned third embodiment was described.

In this embodiment, as shown in FIG. 6, the through hole 41 that is formed in the one end portion 24a of the auxiliary board 24 is widened at least to a size that permits a tip portion of a soldering iron used for the soldering works to be inserted and removed. Consequently, it is possible to insert the tip portion of the soldering iron into the through hole 41 and press the tip against the inner wall thereof for filling the solder used for the soldered portion 32 during the soldering process, and thereby improve reliability of the connection through the soldered portion 32 and make the soldering process easier. At the same time, when the soldering iron is removed from the through hole 41 after the solder used for the soldered portion 32 has been filled, it is also possible to check visually if the soldering has been reliably conducted. It is also possible, in implementing this embodiment, to adopt a photoresist similar to the photoresist 42 as described in the third embodiment.

In the second to fourth embodiments, the one end portion 24a of the auxiliary board 24 is laid on the one end portion 14a of the circuit board 14. However, it is also possible to lay the one end portion 14a of the circuit board 14 on the one end portion 24a of the auxiliary board 24. In such a case, this can be achieved by merely forming a recess in the inner surface of the case 1 at the side of the output terminal 3 for laying the auxiliary board 24, a through hole 41 in the one end portion 14a of the circuit board 14, and a photoresist 42 on and around the perimeter of the circuit land pattern formed on the one end portion 24a of the auxiliary board 24.

Obviously, many modifications and variations of the present invention are possible in light of the above teachings. It is therefore to be understood that within the scope of the appended claims, the invention may be practiced other than as specifically described.

What is claimed is:

1. A satellite broadcast reception converter comprising:
a chassis including a primary reflector configured to receive radio wave signals from an external parabola antenna, and an output terminal connectable to an external tuner, are positioned a predetermined distance from each other so that signals fed from the primary reflector are amplified and converted into intermediate-frequency output signals and fed out through the output terminal;
a circuit board having an end portion connected to the primary reflector and another end portion; and
an auxiliary board having an end portion connected to the output terminal via a lead wire and another end portion, wherein
the other end portion of the circuit board and the other end portion of the auxiliary board are connected together, and the circuit board and the auxiliary board are laid in a contiguous sequence in the chassis in such a manner that the circuit board is laid closer to the primary reflector and the auxiliary board is laid closer to the output terminal,
the circuit board and the auxiliary board are laid in such a way that said other end portion of the circuit board and said other end portion of the auxiliary board are adjacent to but separated from each other, and
the other end portion of the circuit board and the other end portion of the auxiliary board are connected together via a pin having a "U" shape in longitudinal section view.

2. A satellite broadcast reception converter comprising:
a chassis including a primary reflector configured to receive radio wave signals from an external parabola antenna, and an output terminal connectable to an external tuner, are positioned a predetermined distance from each other so that signals fed from the primary reflector are amplified and converted into intermediate-frequency output signals and fed out through the output terminal;
a circuit board having an end portion connected to the primary reflector and another end portion; and
an auxiliary board having an end portion connected to the output terminal via a lead wire and another end portion, wherein
the other end portion of the circuit board and the other end portion of the auxiliary board are connected together, and the circuit board and the auxiliary board are laid in a contiguous sequence in the chassis in such a manner that the circuit board is laid closer to the primary reflector and the auxiliary board is laid closer to the output terminal,
the other end portions of the circuit board and the auxiliary board are laid on each other,
one of said other end portion of the circuit board and said other end portion of the auxiliary board that is laid on top of the other includes a through hole, and the circuit board and the auxiliary board are connected together electrically through solder tilled in the through hole.

3. The satellite broadcast reception converter as claimed in claim 2, wherein
a size of the through hole is at least such that a tip of a sold iron for use in a soldering process is allowed to be inserted and removed.

4. The satellite broadcast reception converter as claimed in claim 2, wherein
an elevation enclosed in the through hole and regulating an amount of solder to be filled is formed on said other end portion of whichever of the circuit board and the auxiliary board the through hole is not provided.

5. A satellite broadcast reception converter comprising:
a chassis including a primary reflector for receiving radio wave signals from an external parabola antenna and an output terminal connectable to an external tuner and located a predetermined distance from said primary reflector;
a circuit board comprising circuitry for receiving signals from said primary reflector, amplifying the signals, converting the signals into intermediate-frequency output signals, and feeding the output signals to said output terminal, said circuit board including a first end connected to the primary reflector and a second end;
an auxiliary board having a first end and a second end;
a lead wire connected between said auxiliary board second end and said output terminal; and
a connector electrically connecting said circuit board second end and said auxiliary board first end, wherein
said circuit board and said auxiliary board are arranged in said chassis such that said circuit board is closer to said primary reflector than to said output terminal and said auxiliary board is closer to said output terminal than to said primary reflector,
said circuit board second end is adjacent to said auxiliary board first end, and
said connector comprises a U-shaped pin.

6. A satellite broadcast reception converter comprising:
a chassis including a primary reflector for receiving radio wave signals from an external parabola antenna and an output terminal connectable to an external tuner and located a predetermined distance from said primary reflector;
a circuit board comprising circuitry for receiving signals from said primary reflector, amplifying the signals converting the signals into intermediate-frequency output signals, and feeding the output signals to said output terminal, said circuit board including a first end connected to the primary reflector and a second end;
an auxiliary board having a first end and a second end;
a lead wire connected between said auxiliary board second end and said output terminal; and
a connector electrically connecting said circuit board second end and said auxiliary board first end, wherein
said circuit board and said auxiliary board are arranged in said chassis such that said circuit board is closer to said primary reflector than to said output terminal and said auxiliary board is closer to said output terminal than to said primary reflector,
one of either (i) said auxiliary board first end is supported by said circuit board second end and (ii) said circuit board second end is supported by said auxiliary board first end,
one of said circuit board second end and said auxiliary board first end that is supported the other includes a through hole, and
said circuit board and said auxiliary board are connected together electrically by solder in said through hole.

7. The satellite broadcast reception converter as claimed in claim 6, wherein
said through hole is large enough to accommodate a tip of a soldering iron.

8. The satellite broadcast reception converter as claimed in claim 6, wherein
the one of said circuit board second end and said auxiliary board first end that does not include said through hole includes an elevation enclosed in said through hole for regulating an amount of solder joining said circuit board and said auxiliary board.

* * * * *